United States Patent
Chiueh et al.

(10) Patent No.: US 7,277,479 B2
(45) Date of Patent: Oct. 2, 2007

(54) RECONFIGURABLE FIR FILTER

(75) Inventors: Tzi-Dar Chiueh, Taipei (TW);
Kuan-Hung Chen, Taipei (TW)

(73) Assignees: Mediatek Inc., Hsin-Chu (TW);
National Taiwan University, Taipei (TW)

( * ) Notice: Subject to any disclaimer, the term of this patent is extended or adjusted under 35 U.S.C. 154(b) by 783 days.

(21) Appl. No.: 10/248,920

(22) Filed: Mar. 2, 2003

(65) Prior Publication Data

US 2004/0170223 A1 Sep. 2, 2004

(51) Int. Cl.
*H03K 7/00* (2006.01)
*G06F 17/10* (2006.01)

(52) U.S. Cl. .................. 375/229; 708/300; 708/301; 708/316

(58) Field of Classification Search ........ 375/140–143, 375/146–147, 150, 152, 229, 323, 235, 335, 375/342, 232; 708/319, 300, 322–323, 301, 708/524, 315, 400, 316; 348/607, 611, 614; 370/268, 286, 290, 291, 206, 209, 335, 342
See application file for complete search history.

(56) References Cited

U.S. PATENT DOCUMENTS

| | | | | |
|---|---|---|---|---|
| 5,031,133 A | * | 7/1991 | Sasaki | 708/319 |
| 5,222,035 A | * | 6/1993 | Nakase et al. | 708/319 |
| 5,268,877 A | * | 12/1993 | Odell | 367/103 |
| 5,287,299 A | * | 2/1994 | Lin | 708/627 |
| 5,345,426 A | * | 9/1994 | Lipschutz | 367/103 |
| 5,479,363 A | * | 12/1995 | Willson et al. | 708/319 |
| 5,831,880 A | * | 11/1998 | Lee | 708/319 |
| 6,035,312 A | * | 3/2000 | Hasegawa | 708/322 |
| 6,108,681 A | * | 8/2000 | Wittig et al. | 708/319 |
| 6,163,788 A | * | 12/2000 | Chen et al. | 708/319 |
| 6,590,931 B1 | * | 7/2003 | Wittig | 375/231 |
| 6,633,847 B1 | * | 10/2003 | Fang | 704/270 |
| 7,164,712 B2 | * | 1/2007 | Wittig | 375/229 |

OTHER PUBLICATIONS

R. M. Hewlitt and E. S. Swartzlander Jr., "Canonical Signed Digit Representation for FIR Digital Filters," IEEE Workshop on Signal Processing Systems, 2000, pp. 416-426.
M. Yamada and A. Nishihara, "High-Speed FIR Digital Filter with CSD Coefficients Implemented on FPGA," in Proc. of the ASP-DAC, 2001, pp. 7-8.
Y. M. Hasan, L. J. Karam, M. Falkinburg, A Helwig, and M. Konning, "Canonic Signed Digit Chebyshev FIR Filter Design," IEEE Signal Processing Letters, vol. 8, pp. 167-169, Jun. 2001.

(Continued)

*Primary Examiner*—Mohammed Ghayour
*Assistant Examiner*—Sophia Vlahos
(74) *Attorney, Agent, or Firm*—Winston Hsu (57) ABSTRACT

A series of digit processing units (DPUs) are connected to form a finite impulse response (FIR) filter. Each DPU includes a register, a multiplexer, and a coefficient multiplier. The register stores and delays an input digital signal to be filtered. The multiplexer has inputs connected to the input node and to an output of the register, an output of the multiplexer for connecting to a next stage DPU. The coefficient multiplier is connected to the output of the register and multiplies the input signal by a coefficient or part of a coefficient. A group of DPUs can have multiplexers set so that the register of each DPU stores the same part of the input signal for processing a single filter coefficient. An adder is provided to sum output of the DPUs and output a filtered signal. The critical path of the FIR filter is independent of coefficient number and precision.

10 Claims, 5 Drawing Sheets

OTHER PUBLICATIONS

T. Zhangwen, Z. Zhanpeng, Z. Jie, and M. Hao, "A High-Speed, Programmable, CSD Coefficient FIR Filter," in Proc. of 4th International Conference on ASIC, 2001, pp. 397-400.

K. T. Hong, S. D. Yi, and K. M. Chung, "A High-Speed Programmable FIR Digital Filter Using Switching Arrays," in Proc. of IEEE Asia Pacific Conference on Circuits and Systems, 1996, pp. 492-495.

K. Y. Khoo, A. Kwentus, and A. N. Willson Jr. "A Programmable FIR Digital Filter Using CSD Coefficients," IEEE, Journal of Solid-State Circuits, vol. 31, pp. 869-874, Jun. 1996.

J. Mitola, "The Software Radio Architecture," IEEE Communications Magazine, vol. 33, pp. 26-38, May 1995.

E. Buracchini, "The Software Radio Concept," IEEE Communications Magazine, vol. 38, pp. 138-143, Sep. 2000.

* cited by examiner

RECONFIGURABLE FIR FILTER

BACKGROUND OF INVENTION

1. Field of the Invention

The present invention relates to digital signal processing, and more specifically, to a programmable digital finite impulse response (FIR) filter.

2. Description of the Prior Art

Finite impulse response (FIR) filters are important components in digital communications systems. Much effort has been made to improve filter performance, reduce hardware, and increase operating speed. In addition, software radios, such as those introduced in J. Mitola, "The Software Radio Architecture," *IEEE Communications Magazine*, vol. 33, pp. 26-38, May 1995 or E. Buracchini, "The Software Radio Concept," *IEEE Communications Magazine*, vol. 38, pp. 138-143, September 2000, have recently gained much attention due to the need for integrated and reconfigurable communications systems. To this end, reconfigurability has become an important issue for future filter design.

FIR filters can be used to perform a wide variety of tasks such as spectral shaping, matched filtering, noise rejection, channel equalization, etc. Hence, various architectures and implementation methods have been proposed to improve the performance of filters with respect to speed and complexity. However, due to the recent explosive proliferation in wired and wireless communication standards, traditional hard-wired devices may be less suitable for future communication needs.

On the other hand, software radio has gained much attention from researchers worldwide due to a strong demand for reconfigurable communication systems capable of performing multi-standard operations. In light of this trend, programmability and reconfigurability need be taken into account in filter architecture design.

A typical N-tap FIR filter can be described by:

$$y[n] = \sum_{i=0}^{N-1} h_i \cdot x[n-i] \quad \text{(Eqn. 1)}$$

where, y[n] is a filtered digital signal, n being an index of elements of the signal;

$h_i$ is a filtering coefficient; and x is an unfiltered digital signal.

It is well known in the art that a canonical signed digit (CSD) representation can be used to reduce the complexity of a digital FIR filter implementation as in R. M. Hewlitt and E. S. Swartzlantler Jr., "Canonical Signed Digit Representation for FIR Digital Filters," in *Proc. of IEEE Workshop on Signal Processing Systems*, 2000, pp.416-426; M. Tamada and A. Nishihara, "High-Speed FIR Digital Filter with CSD Coefficients Implemented on FPGA," in *Proc. of the ASP-DAC*, 2001, pp. 7-8; and Y. M. Hasan, L. J. Karem, M. Falkinburg, A. Helwig, and M. Ronning, "Canonic Signed Digit Chebyshev FIR Filter Design," *IEEE Signal Processing Letters*, vol. 8, pp. 167-169, June 2001, for example. Encoding filter coefficients using a CSD representation reduces the number of partial products and thus saves silicon area and power consumption in hardware implementation. Hence, this technique has been popular for fixed-coefficient implementation of FIR filters. According to the CSD representation:

$$h_i = \sum_{k=0}^{M_i-1} d_{i,k} \cdot 2^{-p_k} \quad \text{(Eqn. 2)}$$

and thus, $$y[n] = \sum_{i=0}^{N-1} \sum_{k=0}^{M_i-1} d_{i,k} \cdot 2^{-p_k} \cdot x[n-i] \quad \text{(Eqn. 3)}$$

where, $d_{i,k}$ is an element of the set $\{1, 0, -1\}$;

$p_k$ is an element of the set $\{0, \ldots, L\}$, where L+1 is the length of the coefficients;

and $M_i$ is the number of nonzero digits in $h_i$.

When applying the CSD representation to implementing programmable, rather than fixed-coefficient, FIR filters, it is only natural to implement the same number of programmable CSDs for each filter coefficient to maintain regularity. However, for most filters, only a few taps require high-precision coefficients. Valuable hardware resources will be wasted if all taps are implemented with the highest precision. To minimize hardware complexity, programmable FIR filters restricting the number of allowable nonzero CSDs in every tap have been proposed in T. Zhangwen, Z. Zhanpeng, Z. Jie, and M. Hao, "A High-Speed, Programmable, CSD Coefficient FIR Filter," in *Proc. of 4th International Conference on ASIC*, 2001, pp.397-400; and in K. T. Hong, S. D. Yi, and K. M. Chung, "A High-Speed Programmable FIR Digital Filter Using Switching Arrays," in *Proc. of IEEE Asia Pacific Conference on Circuits and Systems*, 1996, pp. 492-495. Unfortunately, this restriction may lower the coefficient precision and degrade the frequency response of the filter, and it may also induce a large overhead by assigning more CSDs than necessary to most taps. Another hardware-efficient implementation of programmable FIR filters with CSD coefficients has been presented in K. Y. Khoo, A. Kwentus, and A. N. Willson Jr., "A Programmable FIR Digital Filter Using CSD Coefficients," *IEEE Journal of Solid-State Circuits*, vol. 31, pp. 869-874, June 1996. This implementation includes a 32-tap linear-phase filter with two nonzero CSDs in each tap. Additional nonzero CSDs can be allocated to specific filter taps, making it a reconfigurable FIR filter architecture. Nevertheless, some computational resources can still be unused and the critical path can be quite long in some cases.

Figure 1:
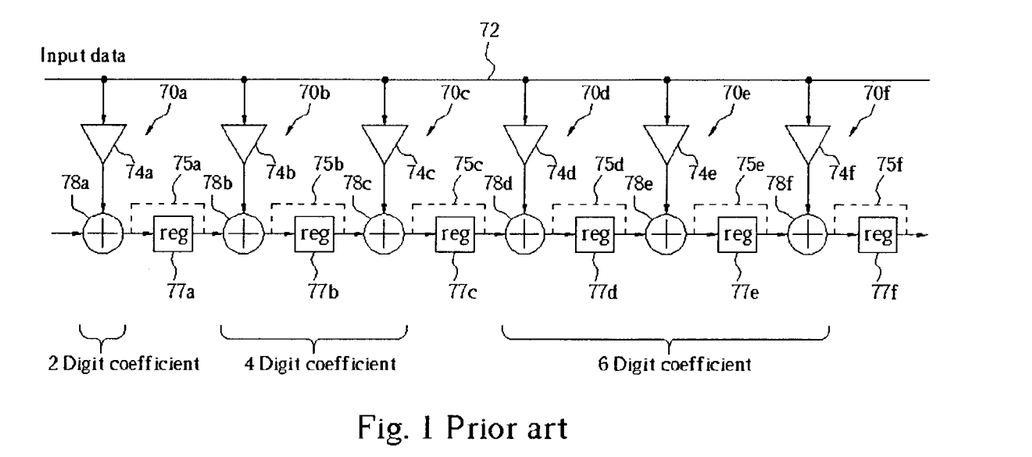
FIG. 1 is a block diagram of a multi-tap programmable filter according to the prior art.

Another state of the art programmable FIR filter is taught by Willson, Jr. et al. in U.S. Pat. No. 5,479,363, which is included herein by reference. Consider FIG. 1 showing taps of a filter of a kind taught in U.S. Pat. No. 5,479,363. The filter comprises a series of p-taps 70a-f that include tap coefficient multipliers 74a-f, adders 78a-f, unit delays (registers) 77a-f, and delay bypass lines 75a-f for filtering digital data on a line 72. Assuming each of the p-taps 70a-f has a two-digit signed coefficient multiplier, bypass lines 77a-f can be selectively connected to bypass specific unit delays, merging p-taps to effectively increase the precision of the coefficient multipliers. This is shown in FIG. 1, where bypass line 75b is active and bypasses the corresponding register 77b such that a four-digit coefficient is realized by multipliers 74b, 74c and adders 78b, 78c. A six-digit coefficient is realized in a similar way. A fundamental shortcoming of the filter of FIG. 1 is that the critical path depends on coefficient precision. In the four-digit coefficient, for example, the critical path includes the multiplier 74b and the two adders 78b, 78c, while the six-digit coefficient has a longer critical path including a multiplier and three adders. This dependence of critical path on precision results in slow, inefficient, and somewhat unpredictable performance.

Generally, the prior art programmable FIR filters suffer from drawbacks of program inflexibility, speed, precision range, and critical path dependence on precision.

SUMMARY OF INVENTION

It is therefore a primary objective of the present invention to provide a highly flexible, reconfigurable FIR filter in which both a tap number and a number of nonzero digits in each tap can be arbitrarily assigned, and in which critical path is independent of coefficient precision.

Briefly summarized, a digit processing unit (DPU) for providing a CSD coefficient to a FIR filter according to the present invention includes a register, a multiplexer, a coefficient multiplier, and an adder. The register is connected to an input node and stores and delays an input digital signal to be filtered. The multiplexer has inputs connected to the input node and to an output of the register, an output of the multiplexer is for connecting to a second DPU. The coefficient multiplier is connected to the output of the register and multiplies the input digital signal by a CSD coefficient and outputs a product. The adder is connected to the coefficient multiplier and adds the product to products of other DPUs, the output of the adder being a component of the filtered digital signal.

According to a preferred embodiment of the present invention, DPUs are connected in series to form a FIR filter, and a group of DPUs can have multiplexers set so that the register of each DPU stores the same part of the digital signal for processing a single filter coefficient. Additionally, the adders of the DPUs are consolidated into a single optimized adder.

A method according to the present invention for filtering an input digital signal according to a function defined by a series of coefficients is also provided. The method serially receives the input digital signal as a series of equal length elements, then, simultaneously multiplies each element of the serially received digital signal by a corresponding coefficient of the series of coefficients, and further adds the products of the multiplications, before finally outputting the sum of the products of the multiplications as the filtered digital signal.

It is an advantage of the present invention that the multiplexers allow DPUs to be combined to process coefficients having a wide range of precisions in the same FIR filter.

It is a further advantage of the present invention that the critical path is a coefficient multiplier and an optimized consolidated adder and is independent of an amount of DPUs processing a single coefficient, that is, coefficient precision or number of digits.

It is a further advantage of the present invention that the FIR filter can be easily configured as a matched filter, a pulse-shaping filter, or other filters.

It is a further advantage of the present invention that the FIR filter has scalability, modularity, and cascadability amenable to VLSI implementation.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
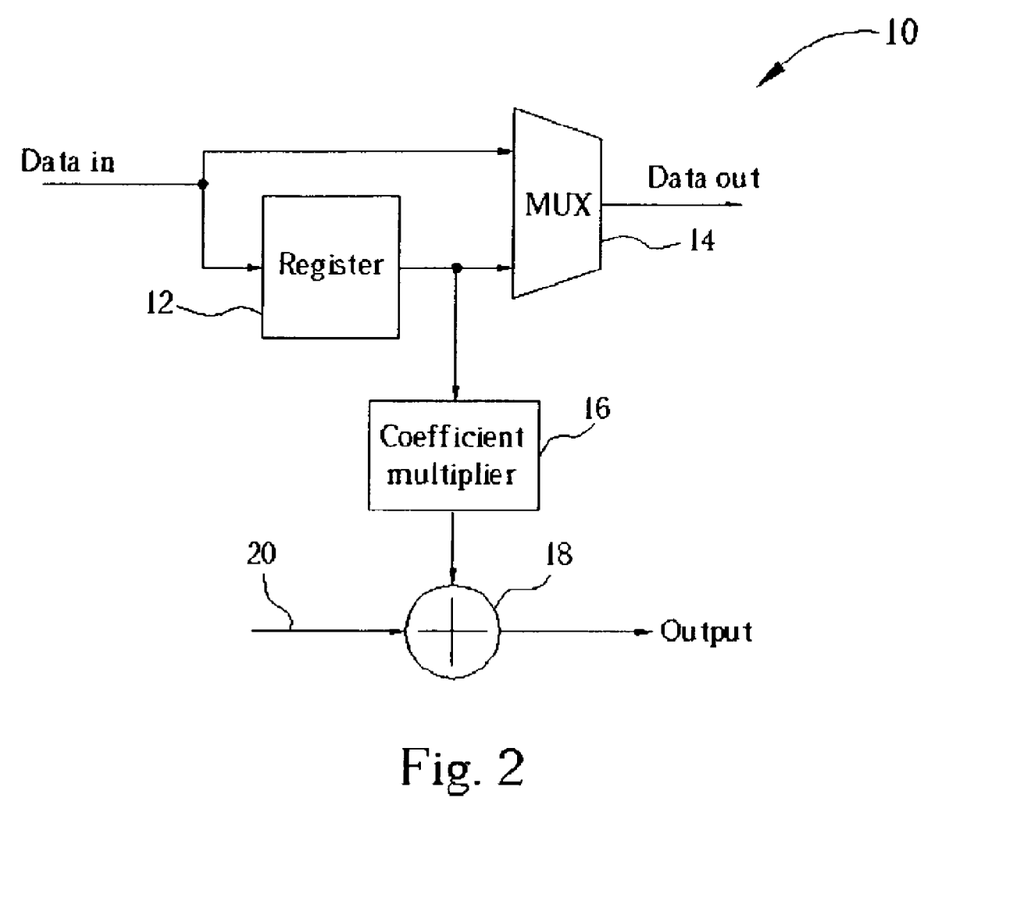
FIG. 2 is a block diagram of a digit processing unit (DPU) according to the present invention.

A generalized digit processing unit (DPU) 10 according to the present invention is illustrated in FIG. 2. The DPU 10 can be connected in a series of stages of like DPUs to form a filter, such as a finite impulse response (FIR) filter common in digital signal processing applications. The DPU 10 includes a delay unit, such as a register 12, for storing and delaying an input digital signal (indicated in FIG. 2 by "Data in"), and a multiplexer 14 for selecting output of the DPU 10 as either the input digital signal or the delayed digital signal output by the register 12. A coefficient multiplier 16 is connected to an output of the register and multiplies the data output by the register 12 by a filter coefficient or part of a filter coefficient, outputting this product to an adder 18. The adder 18 sums the product with output of a prior stage DPU connected at adder input 20. Output of the adder 18 is sent to a next stage DPU, or when the DPU 10 is the last stage, to a filter output.

The coefficient multiplier 16 is programmed with a unit set of canonical signed digits (CSDs) of a filter coefficient, the advantages of using CSDs having been explained previously. For instance, the unit set of CSDs can be a single CSD. When the filter coefficient comprises a single CSD, the multiplexer 16 is set to receive input from the register 12 thereby delaying output to the next stage DPU, which processes another filter coefficient. However, when the CSD representation of the coefficient comprises two CSDs, the multiplexer 16 is set to combine the DPU 10 with the next stage DPU (by forwarding the un-delayed input digital signal) such that two coefficient multipliers operate on the same input digital signal data to realize a two CSD coefficient. In this way, one or more CSDs can be realized with a single or a series of DPUs 10.

Figure 3:
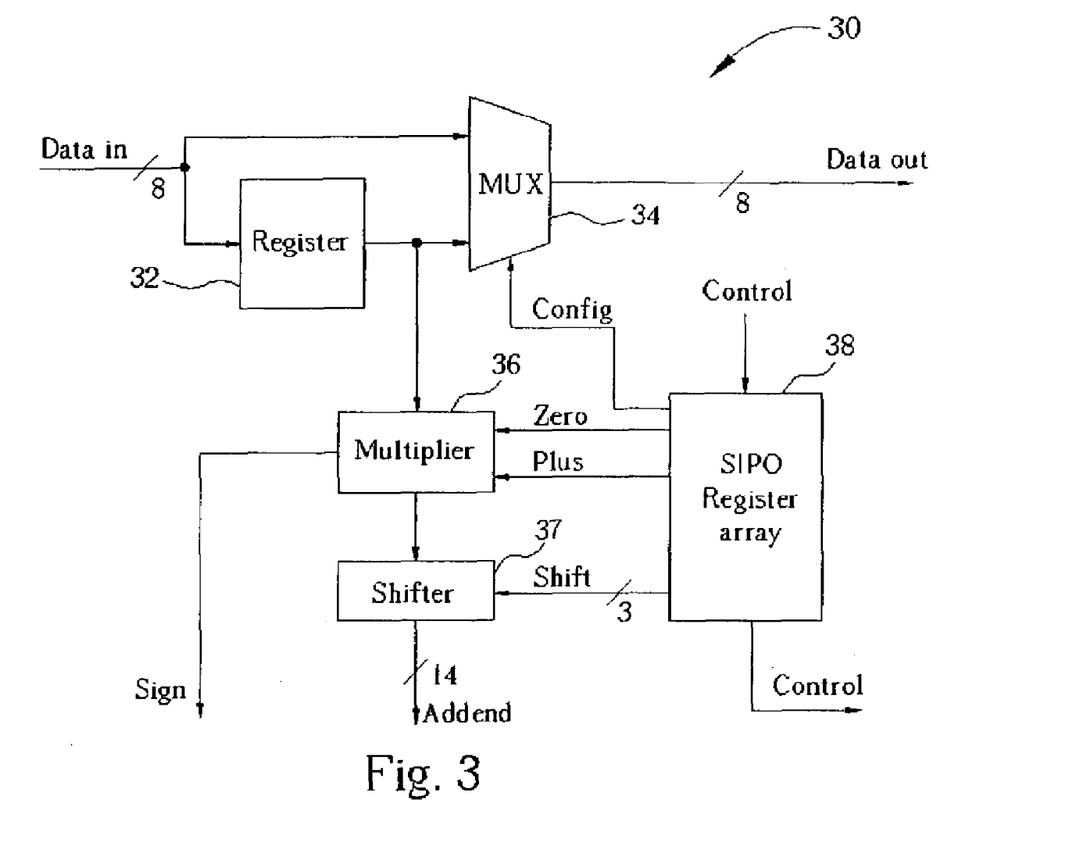
FIG. 3 is a block diagram of a DPU according to the preferred embodiment of the present invention.

FIG. 3 illustrates a DPU 30 according to the preferred embodiment of the present invention. The DPU 30 is similar to the DPU 10 while including further components to optimize operation. In the preferred embodiment, the DPU 30 is set up to accept digital data in 8-bit segments to be multiplied by a single CSD, and accordingly, the DPU 30 has a 14-bit output and a 1-bit output. The DPU 30 includes a delay unit, such as a register 32, for storing and delaying an input digital signal, and a multiplexer 34 for selecting output of the DPU 30 as either the input digital signal or the delayed digital signal output by the register 32. The DPU 30 further comprises a multiplier 36 and a shifter 37 for performing a multiplication of the input data by a CSD of a filter coefficient. A serial-in-parallel-out (SIPO) shift register 38 is provided so that a control string can be loaded. The control string can be serially shifted through the SIPO register 38 to a next stage DPU and includes a configuration bit "config" for setting the multiplexer 32, a "zero" and a "plus" bit for setting the multiplier 36, and three "shift" bits for controlling the shifter 37. Addend and sign output of the shifter 37 and multiplier 36 respectively are forwarded to an adder (not shown). The DPU 30 is to be used in a series of like DPUs to form a filter.

Referring to Eqn. 3 and Table 1, the multiplier 36 is set with the multiplicand $d_{i,k}$, the zero bit indicating a zero value and the plus bit indicating a positive value. The shifter 37 is set to evaluate the multiplicand $2^{-p_k}$, the three shift bits being a binary representation of $p_k$. Working in conjunction, the multiplier 3 and shifter 37 evaluate a single CSD multiplication, that is, the term $$d_{i,k} \cdot 2^{-p_k} \cdot x[n-i]$$

of Eqn. 3.

TABLE 1

| $d_{i,k}$ | zero | plus |
|---|---|---|
| 0 | 1 | 0 |
| −1 | 0 | 0 |
| 1 | 0 | 1 |

As mentioned with reference to Table 1, the multiplier 36 is used to multiply the input data $x[n-i]$ by $d_{i,k}$, which can have values of "1", "0", and "1". If $d_{i,k}$ is "0, the zero signal will be "1" forcing the output of the multiplier 36 to be "0" regardless of input. Otherwise, the zero signal will be 0" and if the CSD coefficient is 1, the plus signal will be "1" and the multiplier output is the same as the input. If the CSD coefficient, $d_{i,k}$, is "−1", the plus signal will be "0" and the output is equivalent to the one's complement representation of the input data. The "1 " required to form the two's complement can be added by the multiplier 36 or, as in the preferred embodiment, accumulated and later added into a summed filter output when the DPU 30 is incorporated into a filter.

The shifter 37 is used to multiply the output of the multiplier 36 $d_{i,k} x[n-i]$ by $2^{-p_k}$, where $p_k$ ranges from "0" to "7". In the preferred embodiment, the shifter 37 performs an arithmetic left shift and expands the 7-bit multiplier output (excluding the most significant bit—MSB) into a 14-bit output by shifting the input left by $7-p_k$ bits. Zeros are padded at the least significant bit (LSB) if $d_{i,k}$ is "1 or 0" and ones are padded if $d_{i,k}$ is −1".

Figure 4:
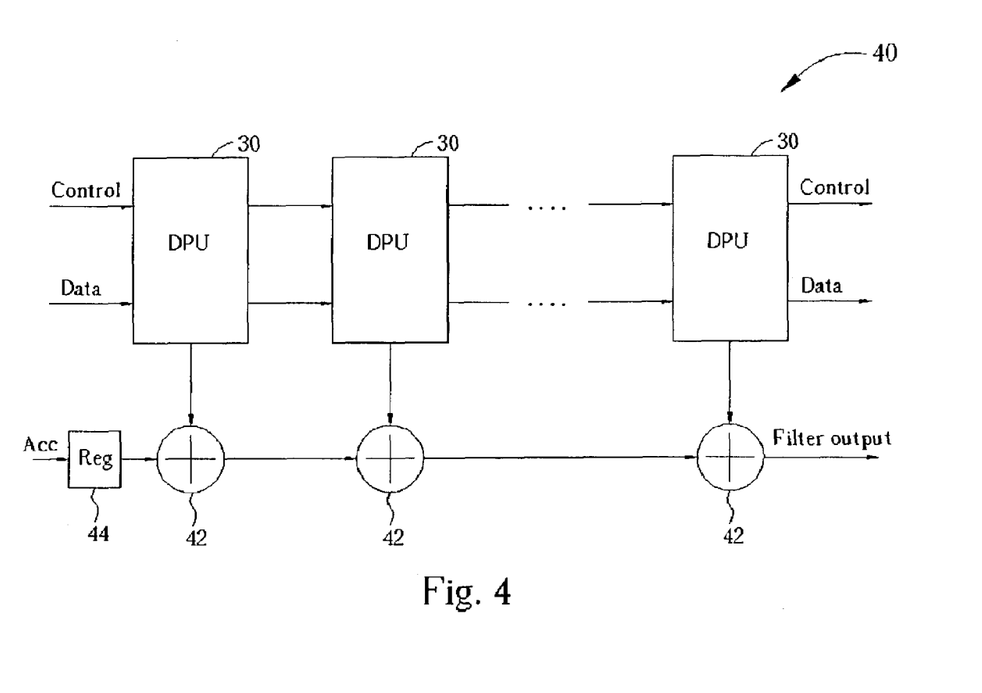
FIG. 4 is a block diagram of architecture of a reconfigurable FIR filter employing the DPU of FIG. 3.

Please refer to FIG. 4 illustrating architecture of a reconfigurable FIR filter 40 employing a series of DPUs 30. The FIR filter 40 includes a series of adders 42 corresponding to the series of DPUs 30, and a register 44 for storing the accumulated "1"s output required to form the two's complement by the multipliers 36 of the DPUs 30 as previously mentioned. The adders 42 receive corresponding sign and addend signals from the DPUs 30 and output a filtered digital signal, each adder 42 processing a partial sum. A pre-calculated control string can be serially fed into the filter 40, via the SIPO registers 38 of the DPUs 30, to link adjacent DPUs with the multiplexers 34, and set the multipliers 36 and shifters 37 according to the desired CSD coefficients. Thus, the FIR filter 40 can reconfigurably process an input digital signal with CSD represented coefficients limited in size and precision only by the number of DPUs 30 incorporated.

Figure 5:
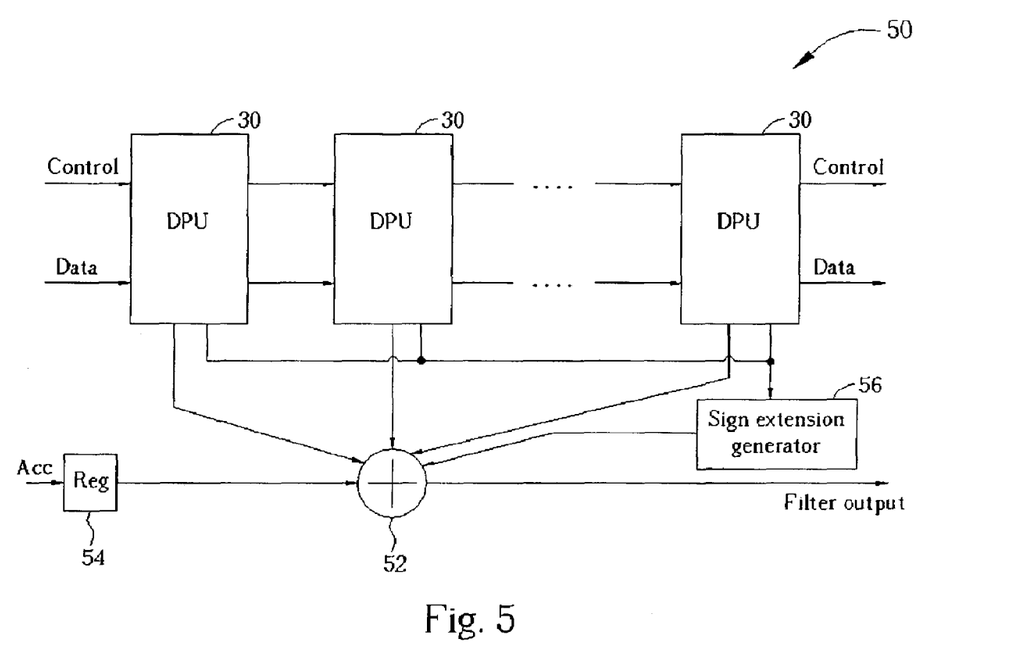
FIG. 5 is a block diagram of a processing element according to the present invention.

Refer to FIG. 5, showing a reconfigurable FIR filter processing element 50 according to the present invention. The processing element 50 has a similar structure to the FIR filter 40, however, the processing element 50 is optimized for reduced latency and efficient IC fabrication. The processing element 50 includes a series of DPUs 30, a combined adder 52, a register 54, and a sign extension generator 56. Because of different precision between the output of DPUs 30 and the accumulated sum of the adder 52, the sign extension generator 56 is required for generation of sign extension bits based on the sign outputs of the DPUs 30. The register 54 stores "Acc", the number of negative CSDs in the DPUs 30, for performing two's complement arithmetic required by the multipliers 36 in the DPUs 30. The adder 52 sums the addend output of the DPUs 30, the output of the sign extension generator 56, and the accumulated sum at the register 54 and outputs a filtered digital signal. The processing element 50 is readily incorporated into a pipeline arrangement that is well known in the art, such as a plurality of processing elements 50 connected in series.

The sign extension generator 56 is required as the accumulated sum at the adder 52 has a longer bit length than the addend output of each DPU 30. For power saving reasons, it is better to handle sign extension bits of the DPUs 30 individually rather than extend the addends of the DPUs 30 to the bit length of the adder 52. The sign extension generator 56 evaluates the sum of the sign extension bits based on the sign signals of the DPUs 30 by examining relations between the number of non-negative sign signals and the sum of the corresponding sign extension bits.

Suppose, for example, that each DPU 30 used in the processing element 50 processes 8-bit data with 8-bit filter coefficients so as to produce a 15-bit output (a 14-bit addend signal and a 1-bit sign signal, referring to FIG. 3). Suppose, for example, that the filter output as well as "Acc" is 24-bit wide, then,the sign extension generator 56 output is accordingly ten bits. The sign extension generator 56 includes a multiplexer that selects the seven MSBs of the output as "1111111" when any DPU 30 has a sign signal of "1", or "0000000" when no sign signal is "1". The sign extension generator 56 sets the three LSBs to equal three LSBs of a binary representation of the number of non-negative sign signals. Thus, in this example, a 10-bit sign extension signal is output by the sign extension generator 56 to the adder 52.

Continuing the example above, the adder 52 sums eight 14-bit addend signals from the eight DPUs 30, one 24-bit accumulated sum at the register 54, and the 10-bit sign extension signal. The adder 52 includes five 14-bit full adder arrays in a two-level arrangement that compress the fourteen LSBs of the accumulated sum at the register 54 and the eight addend signals into four 14-bit signals. A two-level carry save adder is provided to add the ten MSBs at the register 54, the sign extension signal, and the above four 14-bit signals. The adder 52 further comprises an ELM adder, such as in T. P. Kelliher, R. M. Owens, M. J. Irwin, and T. T. Hwang, "ELM-A Fast Addition Algorithm Discovered by a Program," *IEEE Transactions on Computers*, vol. 41, pp.1181-1184, September 1992, modified to reduce the critical path delay and compute the final sum.

It can be seen in FIG. 3 and FIG. 5 that the critical path of the processing element 50 includes a coefficient multiplier (multiplier 36 and shifter 37) and an adder 52 regardless of how many CSDs, and consequently how many DPUs 30, are required to express a filter coefficient. This is also the case for the FIR filter 40 of FIG. 4 provided that the FIR filter 40 is constructed by cascading several processing elements 50 in a pipeline fashion. To be precise, the critical path of the present invention is independent of the filter coefficients.

In practical application, the present invention can be implemented with single poly quadruple-metal 0.35-μm CMOS technology. In accordance with the above-mentioned example of eight DPUs 30 processing 8-bit signal data, measurement results have shown that a fabricated chip consumes 16.5 mW of power when operating at 86 MHz under 2.5V.

In contrast to the prior art, the present invention has a critical path including a coefficient multiplier and an optimized consolidated adder that is independent of coefficient precision or number of digits. Furthermore, the present invention DPUs can be combined to process coefficients having a wide range of precisions in the same configurable FIR filter or processing element, and such a FIR filter is thus scalable, modular, cascadable, and well suited to VLSI implementation.

Those skilled in the art will readily observe that numerous modifications and alterations of the device may be made while retaining the teachings of the invention.

Accordingly, the above disclosure should be construed as limited only by the metes and bounds of the appended claims.

What is claimed is:

1. A processing element for filtering an input digital signal according to a function defined by a series of coefficients, the processing element comprising:
    a series of connected digit processing units (DPUs), a first DPU of the series receiving the input digital signal, each DPU comprising:
        a delay unit receiving the input digital signal from an input of the processing unit or from the previous DPU for storing and delaying the input digital signal;
        a multiplexer capable of selecting a delayed digital input signal from the delay unit or an un-delayed digital input signal bypassing the delay unit, an output of the multiplexer for connecting to a delay unit and a multiplexer of a next stage DPU;
        a coefficient multiplier connected to the output of the delay unit for multiplying the delayed input digital signal by a coefficient and outputting a product; and
        a serial-in-parallel-out (SIPO) shift register capable of serially receiving control signals and outputting control signals to the coefficient multiplier and the multiplexer;
    an adder connected to the coefficient multipliers for summing the products of the coefficient multipliers, wherein the adder outputs a filtered digital signal;
    a second register connected to the adder for storing a number of negative products determined by the coefficient multipliers for performing two's complement arithmetic with the adder; and
    a sign extension generator connected to the adder for generating sign extension bits of the products of the coefficient multipliers;
wherein a group of DPUs have multiplexers set so that the delay unit of each DPU stores a same part of the digital signal and processes a single coefficient of the series of coefficients.

2. The processing element of claim 1 wherein the coefficients are represented as canonical signed digits (CSDs).

3. The processing element of claim 2 wherein each coefficient multiplier comprises:
    a multiplier for multiplying the input digital signal by one, zero, or negative one; and
    a shifter for performing a multiplication by a power of two by shifting the result of the multiplier;
wherein the multiplier and shifter operate according to a corresponding canonical signed digit of the corresponding coefficient.

4. The processing element of claim 1 wherein the delay unit is a register.

5. The processing element of claim 1 wherein the adder comprises a series of partial sum adders corresponding to the series of DPUs, a first partial sum adder being connected to a corresponding coefficient multiplier, each other partial sum adder being connected to a previous partial sum adder and a corresponding coefficient multiplier.

6. A method of filtering an input digital signal according to a function defined by a series of coefficients in a processing unit, the method comprising:
    providing a series of connected digit processing units (DPUs), a first DPU of the series receiving the input digital signal, and each DPU including:
        a delay unit receiving the input digital signal from an input of the processing unit or from the previous DPU for storing and delaying the input digital signal;
        a multiplexer capable of selecting a delayed digital input signal from the delay unit or an un-delayed digital input signal bypassing the delay unit, an output of the multiplexer for connecting to a delay unit and a multiplexer of a next stage DPU;
        a coefficient multiplier connected to the output of the delay unit for multiplying the delayed input digital signal by a coefficient and outputting a product; and
        a serial-in-parallel-out (SIPO) shift register capable of serially receiving control signals and outputting control signals to the coefficient multiplier and the multiplexer;
    summing the products of the coefficient multipliers using an adder connected to the coefficient multipliers for thereby outputting a filtered digital signal;
    storing a number of negative products determined by the coefficient multipliers in a second register connected to the adder for performing two's complement arithmetic with the adder; and
    generating sign extension bits of the products of the coefficient multipliers with a sign extension generator connected to the adder;
wherein a group of DPUs have multiplexers set so that the delay unit of each DPU stores a same part of the digital signal and processes a single coefficient of the series of coefficients.

7. The method of claim 6 wherein the coefficients are represented as canonical signed digits (CSDs).

8. The method of claim 7 wherein each coefficient multiplier comprises:
    a multiplier for multiplying the input digital signal by one, zero, or negative one; and
    a shifter for performing a multiplication by a power of two by shifting the result of the multiplier;
wherein the multiplier and shifter operate according to a corresponding canonical signed digit of the corresponding coefficient.

9. The method of claim 6 wherein the delay unit is a register.

10. The method of claim 6 wherein the adder comprises a series of partial sum adders corresponding to the series of DPUs, a first partial sum adder being connected to a corresponding coefficient multiplier, each other partial sum adder being connected to a previous partial sum adder and a corresponding coefficient multiplier.

* * * * *